US008207261B2

(12) United States Patent
Elia et al.

(10) Patent No.: US 8,207,261 B2
(45) Date of Patent: Jun. 26, 2012

(54) PLASTIC ARTICLES, OPTIONALLY WITH PARTIAL METAL COATING

(75) Inventors: Andri E Elia, Chadds Ford, PA (US); Mark Hazel, Berkshire (GB); Claudio Pierdomenico, Meyrin Geneva (CH); Clive K Robertson, Chadds Ford, PA (US); Mariane Zebri, Cruseilles (FR)

(73) Assignee: E.I. du Pont de Nemours and Company, Wilmington, DE (US)

( * ) Notice: Subject to any disclaimer, the term of this patent is extended or adjusted under 35 U.S.C. 154(b) by 185 days.

(21) Appl. No.: 12/730,622

(22) Filed: Mar. 24, 2010

(65) Prior Publication Data

US 2010/0255325 A1   Oct. 7, 2010

Related U.S. Application Data

(60) Provisional application No. 61/163,130, filed on Mar. 25, 2009, provisional application No. 61/218,624, filed on Jun. 19, 2009.

(51) Int. Cl.
*B28B 1/24* (2006.01)
*C08L 77/00* (2006.01)
*B32B 27/00* (2006.01)

(52) U.S. Cl. ............. 524/607; 264/255; 428/474.4
(58) Field of Classification Search ............. 524/607
See application file for complete search history.

(56) References Cited

U.S. PATENT DOCUMENTS

| 5,098,769 | A |   | 3/1992  | Nakai et al. |         |
|-----------|---|---|---------|--------------|---------|
| 5,324,766 | A | * | 6/1994  | Ikejiri et al. | 524/433 |
| 5,981,692 | A |   | 11/1999 | Leboeuf      |         |
| 7,501,014 | B2 |  | 3/2009  | Poole et al. |         |
| 7,974,018 | B2 |  | 7/2011  | Braune et al. |        |
| 2009/0062452 | A1 | | 3/2009  | Harder et al. |        |

FOREIGN PATENT DOCUMENTS

| DE | 4416986 A1 | 5/1995 |
| DE | 102006010729 A1 | 6/2007 |
| EP | 0406859 A2 | 1/1991 |
| WO | 2007149300 A1 | 12/2007 |
| WO | 2008079367 A1 | 7/2008 |

* cited by examiner

*Primary Examiner* — Yogendra Gupta
*Assistant Examiner* — Alison Hindenlang

(57) ABSTRACT

Disclosed herein is a type of two-shot molded article, comprising a metallizable composition and a less-metallizable composition, that can be partially coated with metal, as well as methods of making the articles.

1 Claim, No Drawings

PLASTIC ARTICLES, OPTIONALLY WITH PARTIAL METAL COATING

CROSS-REFERENCE TO RELATED APPLICATIONS

The present application claims priority to U.S. Provisional Application No. 61/163,130, filed on Mar. 23, 2009. The present application claims priority to U.S. Provisional Application No. 61/218,624, filed on Jun. 19, 2009.

FIELD OF THE INVENTION

The invention relates to methods of making miscellaneous plastic articles comprising at least two molded plastic compositions each having a surface capable of being at least partially coated with metal.

BACKGROUND OF THE INVENTION

Description of Related Art

The disclosure herein relates to articles and the methods of making articles from plastics capable of injection molding by known techniques, where the articles are capable of, and optionally are, coated partially with metal or metals.

Two shot and multi-shot molding is known in the art to obtain articles that could be painted or coated in desired patterns. There are at least three fundamental issues with known art that can be improved to increase the applicability and adoption of such molding: i) adhesion between the distinct polymers or compositions or blends molded; ii) maintaining an acceptable level of differential selectivity of paintability or coatability of the desired surfaces in the article; and maintaining an acceptable level of adhesion of painting or coating to the paintable or coatable surface. In some cases the above factors are counter to each other and as the two polymers or compositions or blends are made into high adhesion and knit line strength there is a loss of differential selectivity during a subsequent painting or coating step.

U.S. Pat. No. 5,098,769 to Nakai et al. discloses an integrally molded article for use in circuit formation that is provided by use of a two-shot injection molding procedure. A previously molded primary thermoplastic resin composition is pretreated for plating and a specifically defined secondary thermoplastic resin composition having a melt viscosity of 200 P. or below is injection molded about preselected portions of the primary molding which are not intended to bear a circuit. Such secondary thermoplastic resin composition comprises an anisotropic melt-forming polyester having a weight average molecular weight of 10,000 or below and a particulate inorganic filler.

Improvements in the methods of manufacture and performance of such multiple-shot molded, partially metal coated articles and related articles are eagerly sought. Valued improvements include, but are not limited to, those in: compositions of each injected molded shot to provide performance such as tensile modulus, transverse stiffness, transverse strength, annealing shrinkage, elongational modulus, appearance, simplicity of manufacture and intercomposition adhesion including metal to composition adhesion; molding performance (for example shrinkage or adhesion) between each injection molded shot as influenced by factors such as molding parameters and mold design and thermal history; treatments and pretreatments of articles for application of metal coating; and physical and chemical composition of the metal coating and the article it adheres to, as it relates to performance such as peel strength, delamination of any layers, appearance, thermal conductivity, strength, electrical conductivity, and corrosion performance.

The current invention is an improvement over known art in developing articles with combination of structural strength and in achieving highly differentially selective metallization.

BRIEF SUMMARY OF THE INVENTION

Disclosed herein is a method comprising: (i) providing a metallizable composition (1) comprising 100 parts of a partially aromatic polyamide and 1 to 200 parts of a metallization-promoting ingredient, (ii) providing a less-metallizable composition (2) comprising 100 parts of a moldable polymer and fewer to no parts of said metallization-promoting ingredient compared to said parts of said metallization-promoting ingredient of said metallizable composition (1), (iii) molding a portion of either composition to provide a molded article, (iv) subsequently molding a portion of the remaining other composition into contact with said molded article, to provide a multi-shot molded article comprising a metallizable surface of said metallizable composition and a less-metallizable surface of said less-metallizable composition, and (v) optionally simultaneously exposing to metallizing conditions at least a portion of said metallizable surface and at least a portion of said less-metallizable surface to produce an article partially coated with metal.

A further disclosure is an article made using the method described herein and above.

DETAILED DESCRIPTION OF THE INVENTION

A molded article of the present invention can be formed in part or in whole by multiple-shot injection molding. Multiple-shot injection molding refers to a molded article formed by first forming a predetermined shape by a primary molding of a primary moldable composition to give a molded article, and integrally molding at least one other molding composition into contact with the primary composition (the most simple case being termed a "two-shot" molding). Further integral molding of the same or other compositions can also be carried out into contact with a previously molded composition of the article to build up another article. The final molded article thus formed is optionally subjected to etching, optionally subjected to catalyst, and other treatments as a pretreatment for metallizing each of one or more times the final molded article, if desired, to form a metal-containing layer. The metallizing may be done by any known technique including electroless or electrolytic deposition. The metal-containing layer may comprise metal-containing sublayers, thus giving a final molded metallized article having a discontinuous metal layer formed thereon. The metal-containing layer can completely cover a contiguous surface of one or more of the compositions of the final molded article. In a preferred embodiment, metallization occurs predominantly or essentially exclusively on a surface of one composition and hardly at all or not at all on the surface of another composition. In another preferred embodiment, contiguous metallization is found on a portion of a surface of one composition and hardly at all or optionally not at all on the surface of another composition. The extent of metallization is conveniently assessed by visual inspection or with optical aids such magnification by a microscope.

A multi-surface molded article can contain one or more distinct surfaces of metallizable composition and less-metallizable composition. Each such surface is surrounded by other surfaces. A metallizable surface can be completely coated by a metal, to form a contiguous-metal-covered surface. The contiguous-metal-covered surface will have an area (for example in square centimeters), namely the contiguous-metal-covered-surface area.

Although a less-metallizable surface is more resistant to metallization, some metallization may occur to produce one or more areas of metallization on any less-metallizable surface. These areas of metallization may not completely cover a less-metallizable surface, and typically cover a smaller percentage, or to a smaller thickness, of any less-metallizable surface than of any metallizable surface simultaneously exposed to metallizing conditions.

After metallizing, any less-metallizable surface can have zero or one or more areas contiguously covered by metal or metals, each being a contiguous-metal-covered surface, having a contiguous-metal-covered-surface area. Of these areas, one or more has the largest area of all such areas. Typically, this largest area on any less-metallizable surface is much smaller than the corresponding largest area on any of the metallizable surfaces as defined above. In other words, actual (and intended) metallized areas on metallizable composition are larger than the largest actual (and unintended) metallized areas on the less-metallizable composition of the article.

Integral molding refers to when an article from a first molding is used in (integrated with) a second molding, that adds material into contact with the article to form a second article.

At least one of the compositions used in the disclosure herein require as an ingredient at least one or more partially aromatic polyamide (PAP).

The partially aromatic polyamide of the invention can be obtained by condensation of at least specific aromatic carboxylic diacids with specific non-aromatic diamines; or; non-aromatic carboxylic diacids with specific aromatic diamines; or; specific aromatic carboxylic diacids with the specific aromatic diamines; or at least specific aminoaromatic carboxylic acids with themselves, any of which may; be condensed with other; carboxylic diacids; diamines; and or aminocarboxylic acids. General techniques for the formation of amide polymers by condensation and other procedures are well known.

The partially aromatic polyamide of the invention comprises amide monomers having both aliphatic and aromatic portions. Suitable monomers are hexamethylene terephthalamide, hexamethylene isophthalamide, tetramethylene terephthalamide, tetramethylene isophthalamide, m-xylylene adipamide, dodecamethylene terephthalamide, dodecamethylene isophthalamide, decamethylene terephthalamide, decamethylene isophthalamide, nonamethylene terephthalamide, nonamethylene isophthalamide, 2-methylpentamethylene terephthalamide, 2-methylpentamethylene isophthalamide, caprolactam-hexamethylene terephthalamide, caprolactam-hexamethylene isophthalamide, and the like, singly or in combination.

In one embodiment of the method disclosed herein a polyamide is included in at least one of the compositions. The polyamide can be obtained by condensation to produce amide groups of at least one specific monomer having a plurality of reactive groups, each reactive group having functionality of either carboxylic acid or primary amine or secondary amine.

An amide polymer or polyamide of the invention and its embodiments are said to be recognizable as being theoretically available through water-removing condensation, although other actual techniques can be used to manufacture the amide polymer. The number of amide groups of the amide polymer is always greater than 10 and less than 1 million, although species with fewer or more or exactly such numbers of amide groups may be part of the compositions of the invention.

A partially aromatic polyamide and a different partially aromatic polyamide are distinguishable by at least one of different monomers or different weight ratios of monomers.

In an embodiment of the invention, a plurality of the compositions at least one or more of the partially aromatic polyamide. For example, in a two-shot molded article, both compositions can include the same, partially aromatic polyamide; in another two-shot molded article, both compositions used can include the same two, partially aromatic polyamides.

Each polymer of a composition is cyclic or has conventional end groups well-known in the art, including amine and carboxylic acid end groups, or is a combination of both. In one embodiment of the invention, at least one polymer of a composition contains at least one end group from incomplete condensation such as at least one of a carboxylic diacid or diamine or aminocarboxylic acid. In yet another embodiment of the invention, at least one polymer of a composition contains at least one end group from a chain stopper such as a monocarboxylic acid lacking amine groups, condensed with an amine; or a monoamine lacking carboxylic acids, condensed with a carboxylic acid, each forming a terminal substituted amide group. Any of these polymers may be the partially aromatic polyamide.

Polyamides are derived from diamines and dicarboxylic acids. By a "partially aromatic polyamide" (PAP) is meant a polyamide derived in part from one or more aromatic dicarboxylic acids. A PAP is derived from one or more aliphatic diamines and one or more dicarboxylic acids, and at least 80 mole percent, preferably at least 90 mole percent and more preferably essentially all or all of the dicarboxylic acid(s) from which the polyamide is derived from are aromatic dicarboxylic acids. Preferred aromatic dicarboxylic acids are terephthalic acid and isophthalic acid, and terephthalic acid is more preferred.

By an "aliphatic polyamide" (AP) is meant a polyamide derived from one or more aliphatic diamines and one or more dicarboxylic acids, and/or one or more aliphatic lactams, provided that of the total dicarboxylic acid derived units present less than 60 mole percent, less than 50 mole percent, less than 40 mole percent, less than 30 mole percent, or more preferably less than 20 mole percent, and especially preferably essentially no or no units derived from aromatic dicarboxylic acids are present.

By an "aliphatic diamine" is meant a compound in which each of the amino groups is bound to an aliphatic carbon atom. Useful aliphatic diamines include diamines of the formula $H_2N(CH_2)_nNH_2$ wherein n is 4 through 12, and 2-methyl-1,5-pentanediamine.

By an "aromatic dicarboxylic acid" is meant a compound in which each of the carboxyl groups is bound to a carbon atom which is part of an aromatic ring. Useful dicarboxylic acids include terephthalic acid, isophthalic acid, 4,4'-biphenyldicarboxylic acid, and 2,6-naphthalenedicarboxylic acid.

Preferred PAPs are those which comprise repeat units derived from one or more of the dicarboxylic acids isophthalic acid, terephthalic acid, adipic acid, and one or more of the diamines $H_2N(CH_2)_nNH_2$ wherein n is 4 through 12, and 2-methylpentanediamine. It is to be understood that any combination of these repeat units may be formed to form a preferred PAP.

Preferred APs are those which comprise repeat units derived from one or more dicarboxylic acids, of the formula $HO_2C(CH_2)_mCO_2H$ wherein m is 2 to 12, isophthalic acid, and terephthalic acid. In an especially preferred dicarboxylic acid is adipic acid (m=4). In these preferred APs comprise the preferred repeat units from diamines are derived from $H_2N(CH_2)_nNH_2$ wherein n is any of 4 through 12, and 2-methylpentanediamine, and the diamine wherein n is 6 is especially preferred. It is to be understood that any combination of these repeat units may be formed to form a preferred AP. Especially preferred specific APs are polyamide-6,6 and polyamide-6 [poly(ε-caprolactam)].

Specific aromatic carboxylic diacids condensed into a partially aromatic polyamide of the invention can be selected from the group consisting of terephthalic acid, isophthalic acid, 1,2-benzene dicarboxylic acid, and combinations thereof.

Specific non-aromatic diamines condensed into a partially aromatic polyamide of the invention can be selected from the group consisting of 1,2-diaminoethane, 1,3-diaminopropane, 1,2-diaminopropane, 1,4-diaminobutane, 1,3-diaminobutane, 1,3-diaminobutane, 1,10-diaminodecane, 1,12-diaminododecane, 1,14-diaminotetradecane, 2,3-diaminobutane, 1,6-diaminohexane, 1,11-diaminoundecane, 2-methyl-pentamethylenediamine, other aliphatic saturated diamines having one to twelve carbon atoms, and combinations thereof.

Specific aromatic diamines optionally condensed into a partially aromatic polyamide of the invention can be selected from the group consisting of 1,2-phenylenediamine, of 1,3-phenylenediamine, 1,4-phenylenediamine, and combinations thereof.

Specific non-aromatic carboxylic diacids condensed into a partially aromatic polyamide of the invention can be selected from the group consisting of malonic acid, maleic acid, succinic acid, adipic acid, dodecanedioic acid, sebacic acid, undecandioic acid, other aliphatic dioic diacids having four to twelve carbon atoms, and combinations thereof.

Specific aminoaromatic carboxylic acids condensed into a partially aromatic polyamide of the invention are selected from the group consisting of one or more of 3-aminobenzoic acid and 4-aminobenzoic acid.

The optional carboxylic diacids optionally condensed into a partially aromatic polyamide of the invention are selected from the group consisting of one or more of the specific aromatic carboxylic diacids, and the specific non-aromatic carboxylic diacids.

The optional diamines optionally condensed into a partially aromatic polyamide of the invention are selected from the group consisting of one or more of the specific aromatic diamines, 1,4-bis(aminomethyl)benzene, 1,3-bis(aminomethyl)benzene, 1,2-bis(aminomethyl)benzene, and the specific non-aromatic diamines.

The optional aminocarboxylic acids optionally condensed into a partially aromatic polyamide of the invention are selected from the group consisting of one or more of the specific aminoaromatic carboxylic acids and 4-(aminomethyl)benzoic acid.

Preferable partially aromatic polyamide of the invention are selected from the first PAP group consisting of one or more of polyamides of amides comprising 51 to 85 mole percent of isophthalic amide, any of 15 to 49 mole percent terephthalic amide, 0 to 34 mole percent succinic amide (the preceding three amide mole percents optionally summing to 100). Preferable partially aromatic polyamide of the invention are selected from the first PAP group consisting of one or more of polyamides of amide derived from 70 to 100 mole percent 1,6-diaminohexane, and 0 to 30 mole (percent of 1,4-diaminobutane. Preferable partially aromatic polyamide of the invention are selected from the first PAP group consisting of one or more of polyamides of amide derived from 0 to 100 mole percent 1,10-diaminodecanane, and 0 to 100 mole percent of 1,4-diaminoundecane, and 0 to 100 mole percent of 1,4-diaminododecane.

In another embodiment, the first PAP group is limited to at least between of 20 and 45 mole percent terephthalic amide. In another embodiment, the first PAP group is limited to at most one of 45 mole percent terephthalic amide.

In another embodiment, the first PAP group is limited to at least between 20 and 45 mole percent isophthalic amide. In another embodiment, the first PAP group is limited to at most one of 25 and 45 mole percent isophthalic amide.

The two compositions that are used in the present method can have different melting points. It is desirable to mold the second composition at a melt temperature that is higher than the melting point of the first molded composition, thereby creating partial softening and/or melting at the areas where the two compositions are in contact. This is easier accomplished when the melting point of the second composition is higher than the melting point of the first composition. This can create some comingling of the compositions or their polyamide(s) or other components, that can promote better bonding. The different compositions molded into contact with each other can each share one or more components, particularly one or more polyamides, most particularly one or more polyamides described herein.

In certain embodiments of the invention, the molding of separate compositions can be done at different melt temperatures or different mold injection temperatures. Preferably the difference of melt temperatures or mold injection temperatures is at least 50 degrees centigrade. The mold temperature may be the same for the one, two, or more mold cavities, or it may be different.

In an embodiment of the invention, the contacting surfaces of the molded compositions can be designed with structures to improve the bond strength between the contacting surfaces. One surface can have one or more instances or types of ridges, pits, buttons, holes, pores, tunnels or undulations creating topography, including other structures known to those in t molding or injection molding.

In an embodiment of the invention, a first article is molded of a composition having a certain melting or minimum practical injection temperature, and the later molding is made at an injection temperature at least 50 degrees centigrade higher than that melting temperature or minimum practical injection temperature of the composition of the first article. In other embodiments, the second molding injection temperature can be at least one of 55, 60, 70, 80, 90, 100, 120, 140, 160, or 175 degrees centigrade higher than that melting temperature or minimum practical injection temperature of the composition of the first molded article. The practical effect of this embodiment can be that the second molding can melt and intermingle somewhat with the first molded composition.

In an embodiment of the invention, at least one of the compositions can contain reinforcement. The reinforcement can include clays, fillers or fibers or the like, optionally in combination. The fibers can include carbon fibers or glass fibers or the like, optionally in combination.

In an embodiment of the invention, the multi-shot molded article has a surface intended for metallization. Metallization can be selected, and may include but is not limited to copper, iron, zinc, cobalt, palladium, chromium, magnesium, manganese, cadmium, niobium, molybdenum, gold, palladium, nickel, tungsten, and combinations thereof. In addition to deposition of metallic elements, a non-metallic element can be co-deposited (for example phosphorous or boron). The metallization can be carried out by immersion in a bath of metallization liquid composition (solution, dispersion, gel, emulsion, etc.) with or without an electrical-current.

Metallization can be faster, thicker, achieve improved adherence, or done at lower temperature, etc., or "promoted"

on the surface by using what is referred to herein as a metallization-promoting ingredient. Metallization-promoting ingredients can include salts, fillers, crystals, polymers, hydrophilic polymers, amide polymers, clays, minerals, calcium carbonate, amide polymers identical to those made from succinic acid, amide polymers identical to those made from hexanedioic acid, amide polymers identical to those made from isophthalic acid and terephthalic acid, amide polymers identical to those made from terephthalic acid, amide polymers identical to those made from isophthalic acid, and crystallization seeds, as can be established by simple experimentation. Specific examples of metallization promoting ingredients are poly(hexamethylene adipamide), calcium carbonate, and combinations thereof.

In the present invention a less-metallizable composition can be more resistant to the etching chemicals used in the metallization process See Table 2. Metallization can be inhibited (somewhat or entirely; slowed, made thinner, stopped or never started, made to require higher temperature, etc.) on the surface of a composition by compositions including a metallization-inhibiting ingredient. Metallization-inhibiting ingredients include polymers, hydrophobic polymers, certain amide polymers, amide polymers identical to those made from sebacic acid, and amide polymers identical to those made from hexanedioic acid. Metallization-inhibiting ingredients also include poly(hexamethylene dodecanediamide) (CAS 26098-55-5).

One can produce an two-shot molded article using the method disclosed herein. An article having two surfaces, each having different metallization characteristics can be simultaneously exposed to metallizing conditions on at least a portion of their respective surfaces. For example, a multi-shot molded article can be exposed, submerged or partially dipped into a bath of metallization liquid composition.

In all cases of metallization, the largest-contiguous-metal-covered-surface area on said metallizable surface after metallization is greater than zero in area; e.g. it has a positive area, metallization occurs to make at least one metallized area. In one case, there are one or more contiguous-metal-layer areas on said less-metallizable surface. In a second case, there are no contiguous-metal-layer areas on said less-metallizable surface, and therefore the area of any and all of those areas is zero, and the largest-contiguous-metal-covered-surface area on said metallizable surface is larger.

The article partially coated by metal is useful in many applications. Where the metal coating is conductive of electricity, the article can be used to provide circuitry, such as in circuit boards, flexible circuitry, communication devices, electronic devices, portable or handheld electronic devices, computers, mobile or cellular phones, personal digital assistants (PDA), calculators, and the like. Where the metal coating is strong, the article can be used in structural members, such as automotive parts, aircraft parts, and the like. When the metal coating is decorative, the article can be used with the metal coating exposed to view, such as a container or covering or case (e.g. a computer case, a cell phone case). Where the metal coating is chemically resistant, the article can be used in containers, seals, gaskets, pipes, or the like.

EXAMPLES

In the examples, amounts of materials used in compositions are given in parts by weight.

Composition 1 was composed of 34.15 parts polyamide 6,6 made from 1,6-diaminohexane and 1,6-hexanedioic acid; 15 parts amorphous polyamide B made from 1,6-diaminohexane as diamine, 70 mole percent isophthalic acid and 30 mole percent terephthalic acid as diacid (mole percents based on total amount of dicarboxylic acids present); 0.40 parts Chimassorb 944 also known as poly[(6-[(1,1,3,3-tetramethylbuty)amino]-1,3,5-triazine-2,4-diyl][(2,2,6,6-tetramethyl-4-piperidinyl)imino]-1,6-hexanediyl[(2,2,6,6-tetramethyl-4-piperidinyl)imino]]); 0.20 parts Irganox 1098 also known as 3,3'-bis(3,5-di-tert-butyl-4-hydroxyphenyl)-N,N'-hexamethylenedipropionamide; 0.25 parts LICOMONT® CAV 102, a calcium salt of montanic acid crystallization promoter available from Clariant GmbH, Augsburg, Germany; 10 parts SUPER-PFLEX 200, a surface-treated, fine particle size, precipitated calcium carbonate with narrow particle size distribution available from Specialty Minerals, Inc., Bethlehem, Pa. having a typical 2% stearic acid surface treatment, average particle size 0.7 microns, +325 mesh residue of 0.03 weight percent, and surface area of 7 meters$^2$/gram; 40 parts flat glass fibers, namely NITTOBO CSG3PA-820, 3 mm long, 28 microns wide, 7 microns thick, aspect ratio of cross-sectional axes equaling 4, having aminosilane sizing, from NITTO BOSEKI, Japan.

Pellets of the composition were prepared by melt blending the components in an extruder, where the glass fibers were fed into the molten polymer matrix with a side feeder. The temperature of that blend was approximately 280 to 310° C. upon exiting the strand die. The strands from the die were quenched in water and pelletized. The pellets were approximately 3 mm in diameter and 5 mm in length. The thus prepared pelletized composition was then dried at 100° C. for 6-8 hours in dehumidified dryer and then molded into a standard ISO 294 type D2 plaque of 6 cm×6 cm×2 mm, at a melt temperature of 280 to 300° C. and mold temperature of 85-105° C.

A plaque was metallized by etching for 5-20 minutes at 35-50° C. with 1.08 to 1.33 (Eq H+)/L HCl in ethylene glycol (also including other ingredient(s) of PM-847 at approximately 230 to 270 mL/L, where PM-847 is about 22.5 wt % calcium chloride and about 13.75 wt % hydrogen chloride, obtained from Rohm and Haas Company, Philadelphia, Pa.), followed by a water rinse for 2 minutes at room temperature, followed by an ultrasonic water rinse for 5-15 minutes at room temperature, followed by a water rinse for 1 minute at room temperature, followed by activation with a solution of 150 ppm palladium ions (also including other ingredient(s) of PM-857, from Rohm and Haas Company, Philadelphia, Pa.), with mechanical stirring for 5-10 minutes at 30° C., followed by a water rinse for 2 minutes at room temperature, followed by acceleration with an aqueous solution of accelerator (PM-867, from Rohm and Haas Company, Philadelphia, Pa.), followed by a water rinse for 1 minute at room temperature, followed by electroless nickel deposition (PM-980, from Rohm and Haas Company, Philadelphia, Pa.) for 10-30 minutes at 45 DC while pumping the plating solution, followed by a water rinse for 1 minute at room temperature, followed by a galvanic copper deposition of about a 20 micron thickness of metallic copper from aqueous copper sulphate for 40 minutes at room temperature with mechanical stirring, followed by a water rinse for 1 minutes at room temperature, and finishing by drying the plated article. In the case of composition 1, the article had a metal coating of uniform and adequate appearance.

The peel strength of the copper from the plated article from composition 1 was measured by a Z005 tensile tester (Zwick USA LP, Atlanta, Ga.) with a load cell of 2.5 kN using ISO test Method 34-1. An electroplated plaque was fixed on a sliding table which was attached to one end of the tensile tester. Two parallel cuts 1 cm apart were made into the metal surface so that a band of metal on the surface 1 cm wide was created. The table slid in a direction parallel to the cuts. The 1 cm wide copper strip was attached to the other end of the machine, and the metal strip was peeled (at a right angle) at a test speed of 50 mm/min (temperature 23° C., 50% relative humidity). The peel strength of the composition 1 plated article was found to be 5.9 N/cm$^2$.

Composition 2 was composed of 41.10 parts polyamide 6,6; 18.05 parts amorphous polyamide B composed of 1,6-diaminohexane, 70 mole percent isophthalic acid and 30 mole percent terephthalic acid (mole percents based on total amount of dicarboxylic acids present); 0.40 parts Chimassorb 944 also known as poly[(6-[(1,1,3,3-tetramethylbuty) amino]-1,3,5-triazine-2,4-diyl][(2,2,6,6-tetramethyl-4-piperidinyl)imino]-1,6-hexanediyl[(2,2,6,6-tetramethyl-4-piperidinyl)imino]]); 0.20 parts Irganox 1098 also known as 3,3'-bis(3,5-di-tert-butyl-4-hydroxyphenyl)-N,N'-hexamethylenedipropionamide; 0.25 parts LICOMONT® CAV 102, a calcium salt of montanic acid crystallization promoter available from Clariant GmbH, Augsburg, Germany; 40 parts flat glass fibers, namely NITTOBO CSG3PA-820, 3 mm long, 28 microns wide, 7 microns thick, aspect ratio of cross-sectional axes equaling 4, having aminosilane sizing, from NITTO BOSEKI, Japan.

Pellets of the composition 2 were prepared by melt blending as for composition 1; a plaque was prepared and treated as was for Composition 1 to produce a plated article. Plating was patchy. The analogously tested peel strength corresponding to composition 2 was 1.9 N/cm$^2$.

Composition 3 was composed of 9.05 parts amorphous polyamide B composed of 1,6-diaminohexane, 70 mole percent isophthalic acid and 30 mole percent terephthalic acid (mole percents based on total amount of dicarboxylic acids present); 0.40 parts Chimassorb 944 also known as poly[(6-[(1,1,3,3-tetramethylbuty)amino]-1,3,5-triazine-2,4-diyl] [(2,2,6,6-tetramethyl-4-piperidinyl)imino]-1,6-hexanediyl [(2,2,6,6-tetramethyl-4-piperidinyl)imino]]); 0.20 parts Irganox 1098 also known as 3,3'-bis(3,5-di-tert-butyl-4-hydroxyphenyl)-N,N'-hexamethylenedipropionamide; 0.25 parts LICOMONT® CAV 102, a calcium salt of montanic acid crystallization promoter available from Clariant GmbH, Augsburg, Germany; 36.6 parts amorphous polyamide 10,10 (polyamide of 1,10-decanedioic acid and 1,10-decanediamine); 3.5 parts amorphous polyamide D composed of 1,6-diaminohexane and 82 mole percent 1,12-dodecyldioic acid and 18 mole percent terephthalic acid; 50 parts flat glass fibers, namely NITTOBO CSG3PA-820, 3 mm long, 28 microns wide, 7 microns thick, aspect ratio of cross-sectional axes equaling 4, having aminosilane sizing, from NITTO BOSEKI, Japan.

Pellets of the composition 3 were prepared by melt blending as for composition 1 at melt temperature approximately 230 to 260° C.; a plaque was prepared at molding melt temp approximately 230 to 260° C. and treated to produce a plated article as in Compositions 1 and 2. Plating attempts failed. No ly tested peel strength corresponding to composition 3 could be obtained.

Composition 4 was composed of 8.52 parts amorphous polyamide composed of 1,6-diaminohexane, 70 mole percent isophthalic acid and 30 mole percent terephthalic acid (mole percents based on total amount of dicarboxylic acids present); 0.40 parts Chimassorb 944 also known as poly[(6-[(1,1,3,3-tetramethylbuty)amino]-1,3,5-triazine-2,4-diyl][(2,2,6,6-tetramethyl-4-piperidinyl)imino]-1,6-hexanediyl[(2,2,6,6-tetramethyl-4-piperidinyl)imino]]); 0.20 parts Irganox 1098 also known as 3,3'-bis(3,5-di-tert-butyl-4-hydroxyphenyl)-N,N'-hexamethylenedipropionamide; 0.25 parts LICOMONT® CAV 102, a calcium salt of montanic acid crystallization promoter available from Clariant GmbH, Augsburg, Germany; 32.34 parts polyamide 10,10 (polyamide of 1,10-decanedioic acid and 1,10-decanediamine); 3.24 parts amorphous polyamide D composed of 1,6-diaminohexane and 82 mole percent 1,12-dodecyldioic acid and 18 mole percent terephthalic acid; 10 parts SUPER-PFLEX 200; 45 parts flat glass fibers, namely NITTOBO CSG3PA-820, 3 mm long, 28 microns wide, 7 microns thick, aspect ratio of cross-sectional axes equaling 4, having aminosilane sizing, from NITTO BOSEKI, Japan.

Pellets of the composition 4 were prepared by melt blending as for composition 3; a plaque was y prepared and treated to produce a plated article as in Compositions 1, 2 and 3. Only one or two small spots were metal coated under the conditions attempted. The peel strength of the metal could not be tested.

A metallized multi-shot molded article was made using composition 3 (melting point about 200° C.) to make an injection molded article. Composition 1 (melting point about 265° C.) was then injection molded into contact with the molded article of composition 3 to give a multi-shot molded article. The multi-shot molded article of compositions 1 and 3 benefit from the mixing or partial mixing of the compositions due to the molding conditions including, temperatures and mold design, including thin ribs extending from the main body of the molded article of composition 3. The multi-shot molded article was metallized as above while fully immersed in the metallizing bath to give a metallized multi-shot molded article showing metal completely covering composition 1 and not visible on any significant portion of composition 3.

TABLE 1

| Ingredients | 1 | 2 | 3 | 4 |
|---|---|---|---|---|
| Polymer A | 34.15 | 41.10 | | |
| Polymer B | 15.00 | 18.05 | 9.05 | 8.52 |
| Chimassorb 944FDL | 0.40 | 0.40 | 0.40 | .40 |
| Irganox 1098 | 0.20 | 0.20 | 0.20 | .20 |
| Licomont CAV 102 | 0.25 | 0.25 | 0.25 | .30 |
| Super-Pflex 200 | 10.00 | | | 10.00 |
| Polymer C | | | 36.6 | 32.34 |
| Polymer D | | | 3.5 | 3.24 |
| Nittobo glass CSGPA820 | 40.00 | 40.00 | 50.00 | 45.00 |
| Peel Strength in HCL etching solution, N/cm$^2$ | 5.9 | 1.9 | 0 | 0 |
| Metal on part | Uniform metal coating | Limited patchy metal coating | No metal coating at all | Nearly no metal coating, one or two small spots coated |

Irganox ® 1098 - a phenolic antioxidant available from Ciba, Tarrytown, NY 10591 USA.
Licomont ® CAV 102 - a crystallization promoter available from Clariant GmbH, 85005 Augsburg, Germany
Nittobo ® glass CSGPA820 - a "flat" glass fiber available from Nitto Boseki Co., Ltd., Tokyo 102-8489 Japan (chopped).
Polymer A - polyamide 6,6.
Polymer B - an amorphous polyamide made from 1,6-hexanediamine, 70 mole percent isophthalic acid and 30 mole percent terephthalic acid (mole percents based on total amount of dicarboxylic acids present).
Polymer C - decamethylene diamine sepacic acid (PA1010)
Polymer D is PA612/6T (amine is hexamethylene amine and acids are 12 and terephthalic.
Super-Pflex ® 200 - a precipitated calcium carbonate available from Specialty Minerals, Inc., Bethlehem, PA 18017 USA.

TABLE 2

| Step | Bath Purpose | Additives$^a$ | Stirring | ° C.$^b$ | Minutes |
|---|---|---|---|---|---|
| 1 | Etching | PM847 | mechanical | 35-50 | 5-20 |
| 2 | Rinse | | no | | 2 |
| 3 | Rinse | | ultrasonic | | 5-15 |
| 4 | Rinse | | no | | 1 |

TABLE 2-continued

| Step | Bath Purpose | Additives[a] | Stirring | °C.[b] | Minutes |
|---|---|---|---|---|---|
| 5 | Activator | PM 857 (150 ppm Pd) | mechanical | 30 | 5-10 |
| 6 | Rinse | | no | | 2 |
| 7 | Accelerator | PM867 | mechanical | 30 | 1-3 |
| 8 | Rinse | | no | | 1 |
| 9 | Chemical Ni | PM980 R&S | pump | 45 | 10-30 |
| 10 | Rinse | | | | 1 |
| 11 | Galvanic Cu | CuSO4 | mechanical/air | | 40 |
| 12 | Rinse | | | | 1 |

[a]Aqueous solution Additives marked "PM" are from Rohm & Haas "adiposit" process. Where no additive is indicated, only water was used.
[b]Where no temperature is indicated, ambient temperature used.

What is claimed is:

1. A handheld device, a portable electronic device, or accessory thereof prepared by the method comprising:
   a) providing a metallizable composition (1) comprising:
      (i) 100 parts of a partially aromatic polyamide prepared from aromatic carboxylic diacids selected from 51 to 85 mole percent of isophthalic acid, 15 to 49 mole percent terephthalic acid, and 0 to 34 mole percent succinic acid with the mole percent summing to 100 percent, condensed with 70 to 100 mole percent 1,6-diaminohexane, and 0 to 30 mole percent of 1,4-diaminobutane,
      (ii) 1 to 200 parts of a metallization-promoting ingredient wherein the metallization-promoting ingredient is a combination of poly(hexamethylene adipamide) and calcium carbonate,
   b) providing a less-metallizable composition (2) comprising:
      (iii) 100 parts of a moldable polymer selected from the group consisting of poly(hexamethylene dodecanamide), poly(decamethylene decanamide), poly(hexamethylene isophthalamide), poly(hexamethylene terephthalamide), or combinations thereof, and no parts of said metallization-promoting ingredient of said metallizable composition (1),
   c) molding metallizable composition (1) and (2) using a multi-shot molding method, wherein the difference in melt temperature of metallizable composition (1) and (2) is at least 50 degrees centigrade, to provide an article comprising metallizable composition (1) and (2), and
   d) simultaneously exposing to metallizing conditions said article comprising metallizable composition (1) and (2) to produce an article partially coated with metal.

* * * * *